United States Patent
Nishi et al.

(10) Patent No.: US 11,133,445 B2
(45) Date of Patent: Sep. 28, 2021

(54) RESIN COMPOSITION FOR CIRCUIT BOARD, AND METAL-BASE CIRCUIT BOARD IN WHICH SAME IS USED

(71) Applicant: DENKA COMPANY LIMITED, Tokyo (JP)

(72) Inventors: Taiki Nishi, Shibukawa (JP); Katsunori Yashima, Shibukawa (JP); Yuki Kimoto, Shibukawa (JP); Ikuo Suyama, Isesaki (JP); Katsumichi Kogure, Shibukawa (JP)

(73) Assignee: DENKA COMPANY LIMITED, Tokyo (JP)

( * ) Notice: Subject to any disclaimer, the term of this patent is extended or adjusted under 35 U.S.C. 154(b) by 305 days.

(21) Appl. No.: 16/479,535

(22) PCT Filed: Mar. 16, 2018

(86) PCT No.: PCT/JP2018/010424
§ 371 (c)(1),
(2) Date: Jul. 19, 2019

(87) PCT Pub. No.: WO2018/173945
PCT Pub. Date: Sep. 27, 2018

(65) Prior Publication Data
US 2019/0355885 A1 Nov. 21, 2019

(30) Foreign Application Priority Data
Mar. 22, 2017 (JP) .............................. JP2017-055574

(51) Int. Cl.
*H01L 33/56* (2010.01)
*C08L 83/04* (2006.01)
*B32B 15/08* (2006.01)

(52) U.S. Cl.
CPC ............... *H01L 33/56* (2013.01); *B32B 15/08* (2013.01); *C08L 83/04* (2013.01)

(58) Field of Classification Search
CPC .......... H01L 33/56; H01L 33/62; C08L 83/04; B32B 15/08; H05K 2201/0266; H05K 2201/0209; H05K 1/0204; H05K 1/0373; H05K 1/056; H05K 2201/0162; H05K 2201/10106; C08K 2003/282; C08K 2003/2227
See application file for complete search history.

(56) References Cited

U.S. PATENT DOCUMENTS

| | | | |
|---|---|---|---|
| 2008/0308828 A1 | 12/2008 | Kashiwagi et al. | ............ 257/98 |
| 2013/0002061 A1 | 1/2013 | Katayama | ..................... 257/100 |
| 2016/0108240 A1 | 4/2016 | Kashiwagi et al. | ................ 83/4 |

FOREIGN PATENT DOCUMENTS

| | | |
|---|---|---|
| CN | 101919320 A | 12/2010 |
| CN | 103003725 A | 3/2013 |
| JP | H 11-150345 A | 6/1999 |
| JP | 2002-114836 A | 4/2002 |
| JP | 2005-281509 A | 10/2005 |
| JP | 2009-56791 A | 3/2009 |
| JP | 2009-235368 A | 10/2009 |
| JP | 2011-94147 A | 5/2011 |
| JP | 2013-23603 A | 2/2013 |
| JP | 2013-203874 A | 10/2013 |
| JP | 2016-79320 A | 5/2016 |
| WO | WO-2012039322 A1 * | 3/2012 ............. H01L 33/56 |

OTHER PUBLICATIONS

International Search Report dated Jun. 5, 2018, issued to International Application No. PCT/JP2018/010424.

\* cited by examiner

*Primary Examiner* — Nathan L Van Sell
(74) *Attorney, Agent, or Firm* — Stein IP, LLC

(57) ABSTRACT

Provided are a metal-base circuit board having excellent solder crack resistance, thermal conductivity, adhesive property, and insulation property and a resin composition for a circuit board used for the metal-base circuit board. A resin composition for a circuit board comprises a vinylsilyl group-containing polysiloxane (having a vinylsilyl group equivalent of 0.005 to 0.045 mol/kg) comprising (A) a dual-end type vinylsilyl group-containing polysiloxane having a weight average molecular weight of 30,000 to 80,000 and (B) a side-chain dual-end type vinylsilyl group-containing polysiloxane having a weight average molecular weight of 100,000 or more, a hydrosilyl group-containing polysiloxane (having a hydrosilyl group equivalent of 6 mol/kg or more), and an inorganic filler at 60 to 80% by volume. The mass ratio of (A) to (B), (A)/(B), is 80/20 to 30/70, and the molar ratio of (C) a hydrosilyl group to (D) a vinylsilyl group, (C)/(D), is 2.5 to 5.0.

4 Claims, No Drawings

RESIN COMPOSITION FOR CIRCUIT BOARD, AND METAL-BASE CIRCUIT BOARD IN WHICH SAME IS USED

CROSS-REFERENCE TO RELATED APPLICATIONS

This application is a national stage of International Application No. PCT/JP2018/010424, filed Mar. 16, 2018, which claims the benefit of priority to Korean Application No. 2017-055574, filed Mar. 22, 2017, in the Japanese Patent Office, the disclosures of which are incorporated herein by reference.

TECHNICAL FIELD

The present invention relates to a resin composition for a circuit board and a metal-base circuit board comprising the resin composition.

BACKGROUND ART

As recent electronic devices typified by smartphones, LED lighting devices, and power modules have higher performances and smaller sizes, mounting technology has rapidly developed in each stratum of semiconductor devices, printed wiring board mounting, and device mounting. This increases the heat density in an electronic device year after year, and the way of efficiently dissipating heat generated in use is an important subject. On this account, a metal-base circuit board with an exothermic electronic component such as LEDs is required to have, in addition to insulation property and adhesive property, high thermal conductivity that has not been achieved yet.

The exothermic electronic component mounted on such a metal-base circuit board is joined with solder on a metal circuit of the metal-base circuit board in order to ensure electrical conduction. However, it has been known that when the temperature in a usage environment of, for example, electronic devices for cars greatly changes, a difference in linear expansion coefficient between constituent materials generates thermal stress that concentrates on solder to cause cracks, resulting in conduction failure.

Since 2000, the environmental regulation has been strengthened due to RoHS directive and ELV directive to limit the use of lead, a lead-free solder for use in electronic devices has been aggressively developed and introduced. The lead-free solder, however, has a higher elastic modulus than conventional lead-containing solders, thus is likely to be affected by expansion and contraction due to temperature changes, and also has hard and brittle characteristics. In such circumstances, there is a demand for a metal-base circuit board that is unlikely to generate cracks even with the lead-free solder and has excellent insulation property, adhesive property, and thermal conductivity.

A conventional insulating layer practically used in a metal-base circuit board ensures insulation property, adhesive property, and heat dissipation property by densely packing an inorganic filler in a thermosetting resin having excellent adhesive property to metal, such as an epoxy resin and a polyimide resin. Such an insulating layer is, however, prepared by densely packing the inorganic filler in the thermosetting resin having a rigid skeleton, thus has a high elastic modulus, and is likely to generate cracks in solder unfortunately.

To address this problem, an insulating layer having low elastic modulus and excellent stress relaxation property has been developed by controlling the main chain skeletons of an epoxy resin and a curing agent.

For example, Patent Document 1 is intended to provide a metal-base circuit board having excellent adhesion property of an insulating layer to a metal plate and a conductive circuit, having excellent stress relaxation property, and having such excellent heat dissipation property even with a large chip (6332M) as not to cause defects including cracks in or near solder by sudden heating/cooling.

Patent Document 1 therefore discloses a metal-base circuit board comprising a circuit through an insulating layer having a multi-layer structure on a metal plate, and in the metal-base circuit board, the insulating layer comprises a rubber composition layer and a resin composition layer.

Another metal base substrate comprising a silicone resin having soft Si—O—Si (a bond angle of 143°, a bond distance of 0.165 nm) has been studied.

The thermal curing reaction for a silicone resin includes four types of 1) dehydration condensation reaction between silanol groups (Si—OH), 2) condensation reaction between a silanol group (Si—OH) and a hydrolyzable group (Si—OR, R is an alkoxy group, an acetoxy group, or the like), 3) reaction of a methylsilyl group (Si—CH$_3$) or a vinylsilyl group (Si—CH=CH$_2$) with an organic peroxide, and 4) addition reaction of a vinylsilyl group (Si—CH=CH$_2$) and a hydrosilyl group (Si—H).

Of them, the reaction 4) of a vinylsilyl group and a hydrosilyl group generates no by-product during the reaction, and thus the application of the addition reaction-type silicone resin to an insulating layer of a metal-base circuit board has been studied.

For example, Patent Document 2 is intended to provide a curable resin composition giving low elastic modulus, excellent adhesive property, and excellent heat resistance and yielding a cured product having higher moisture resistance; and to provide a metal-base circuit board having excellent adhesion between a metal plate and a conductive circuit, having excellent stress relaxation property, and having such excellent heat resistance, moisture resistance, and heat dissipation property as not to cause defects including cracks in or near solder even by sudden heating/cooling. Patent Document 2 therefore discloses a curable resin composition essentially comprising (1) an epoxy resin, (2) a curing agent having a polyether skeleton and having a primary amine group at an end of the main chain, (3) a silane coupling agent having an ureide group and/or a mercapto group, and (4) an inorganic filler.

Patent Document 3 is intended to provide a curable resin compound giving low elastic modulus and giving excellent adhesive property, heat resistance, and moisture resistance and consequently to provide a metal-base circuit board having excellent adhesion between a metal plate and a conductive circuit, also having excellent stress relaxation property, and having such excellent heat resistance, heat dissipation property, and moisture resistance as not to cause defects including cracks in or near solder even by sudden heating/cooling.

Patent Document 3 therefore discloses a curable resin composition comprising (1) an adhesive resin comprising an addition reaction-type silicone resin, (2) a curing accelerator having a silicone skeleton and having at least one active silyl hydrogen bond on the main chain, and (3) an inorganic filler.

Patent Document 4 is intended to provide a low elastic adhesive having excellent stress relaxation property and a laminate comprising the adhesive and to provide a low elastic adhesive having excellent thermal conductivity, a laminate comprising the adhesive, a heat radiation plate with the adhesive, and a metal foil with the adhesive.

Patent Document 4 therefore discloses a low elastic adhesive for cars. The low elastic adhesive comprises a low elastic material having a glass transition temperature of 0° C. or less and having a storage elastic modulus of $1 \times 10^9$ Pa or less at −65° C.; the low elastic material comprises a silicone rubber and an inorganic filler and comprises 40 to 900 parts by mass of the inorganic filler relative to 100 parts by mass of the silicone rubber; and the inorganic filler is alumina.

CITATION LIST

Patent Documents

Patent Document 1: JP-A No. 2002-114836
Patent Document 2: JP-A No. H11-150345
Patent Document 3: JP-A No. 2005-281509
Patent Document 4: JP-A No. 2011-94147

SUMMARY OF THE INVENTION

Technical Problem

In Patent Document 1, the C—C—C bond angle is 109°, the bond distance thereof is 0.140 nm, the C—O—C bond angle is 114°, and the bond distance thereof is 0.142 nm. Hence, even when the polyether skeleton in the invention according to Patent Document 1 is introduced to a curing agent, the elastic modulus of the epoxy resin is limited to be reduced.

Meanwhile, the silicone resin has release property and thus is essentially considered to be difficult to adhere to an adherend such as metal even by any of the above four reaction types.

Patent Document 2, as described above, discloses a metal-base circuit board in which a metal circuit is stacked through an insulating layer having a multi-layer structure on a metal plate. In the invention according to Patent Document 2, a thermosetting resin in at least one layer of the multi-layer structure of the insulating layer is a silicone resin, thus has excellent stress relaxation property, and is capable of suppressing the generation of solder cracks by sudden temperature changes even with a large chip (6332M).

In the invention according to Patent Document 2, however, of the multi-layer structure of the insulating layer, a layer between the layer comprising the silicone resin and the circuit metal comprises an epoxy resin in order to achieve sufficient adhesive property (specifically peel strength). As shown in [Table 2] in Patent Document 2, the layer comprising the epoxy resin has high elastic modulus, and thus anti-solder cracking is limited to be improved. In addition, the adhesion between the layer comprising the silicone resin and the layer comprising the epoxy resin is insufficient.

Patent Documents 3 and 4, as described above, disclose a metal-base circuit board comprising an insulating layer prepared by adding an inorganic filler to an addition reaction-type silicone resin having adhesive property (for example, TSE3033).

The technique requires strong adhesive property between a copper circuit and the insulating layer, but as shown in [Table 3] in the examples described later, use of a commercially available addition-type silicone resin has failed to achieve satisfactory adhesive property (specifically peel strength improvement) for market demand. This is thought to be because the silicone resin has release property and thus is essentially difficult to adhere to an adherend such as metal.

Higher adhesive property and higher thermal conductivity have been strictly required in market trends year after year, and thus there is a demand for a resin composition for a circuit board for use in a metal-base circuit board that is intended to satisfy both particularly high adhesive property (specifically peel strength improvement) and high thermal conductivity (specifically heat dissipation property).

In view of the above circumstances, the present invention is mainly intended to provide a metal-base circuit board having excellent solder crack resistance, thermal conductivity, adhesive property, and insulation property and to provide a resin composition for a circuit board used for the metal-base circuit board.

Solution to Problem

The inventors of the present invention have carried out intensive studies on a resin composition used for a metal-base circuit board and having excellent solder crack resistance, thermal conductivity, adhesive property, and insulation property and have adjusted the composition.

The metal-base circuit board is equipped with an electronic component such as LEDs on a copper circuit and thus requires strong adhesion between the copper circuit and the insulating layer. Unfortunately, the silicone resin essentially has such characteristics as to be difficult to adhere to an adherend including metal. The inventors of the present invention have been intended to provide a silicone resin composition achieving high adhesive property.

As a result of intensive studies, the inventors of the present invention have found that by (1) using a silicone resin composition comprising a vinylsilyl group-containing polysiloxane and a hydrosilyl group-containing polysiloxane, (2) using a dual-end type vinylsilyl group-containing polysiloxane and a side-chain dual-end type vinylsilyl group-containing polysiloxane having different weight average molecular weights at a particular ratio in the vinylsilyl group-containing polysiloxane, and (3) setting the vinylsilyl group equivalent of the vinylsilyl group-containing polysiloxane and the hydrosilyl group equivalent of the hydrosilyl group-containing polysiloxane in particular ranges, a resin composition capable of containing an inorganic filler at a high content and used for a metal-base circuit board having excellent solder crack resistance, thermal conductivity, adhesive property, and insulation property can be produced, and have completed the present invention.

As described above, the silicone resin essentially has such characteristics as to be difficult to adhere to an adherend including metal, but the inventors of the present invention have unexpectedly found that a silicone resin composition comprising components in particular ranges satisfies both high adhesive property and high thermal conductivity.

The present invention adopts the following aspects in order to solve the above problems.

[1] A resin composition for a circuit board comprises component (i), a vinylsilyl group-containing polysiloxane, component (ii), a hydrosilyl group-containing polysiloxane, and component (iii), an inorganic filler.

In the resin composition for a circuit board, the vinylsilyl group-containing polysiloxane as the component (i) comprises (A) a dual-end type vinylsilyl group-containing polysiloxane having a weight average molecular weight of 30,000 to 80,000 and (B) a side-chain dual-end type vinylsilyl group-containing polysiloxane having a weight average molecular weight of 100,000 or more, the mass ratio of (A) to (B), (A)/(B), is 80/20 to 30/70, the vinylsilyl group-containing polysiloxane as the component (i) has a vinylsilyl group equivalent of 0.005 to 0.045 mol/kg, the hydrosilyl group-containing polysiloxane as the component (ii) has a hydrosilyl group equivalent of 6 mol/kg or more, the molar ratio of (C) a hydrosilyl group in the component (ii) to (D) a vinylsilyl group in the component (i), (C)/(D), is 2.5 to 5.0, and the inorganic filler as the component (iii) is contained at 60 to 80% by volume.

[2] In the resin composition for a circuit board, the inorganic filler may comprise (E) an inorganic filler having an average particle size of 35 to 55 μm, (F) an inorganic filler having an average particle size of 20 to 30 μm, (G) an inorganic filler having an average particle size of 8 to 18 μm, and (H) an inorganic filler having an average particle size of 0.3 to 5 μm, the inorganic filler (E) may be contained at 25 to 30% by volume, the inorganic filler (F) may be contained at 15 to 20% by volume, the inorganic filler (G) may be contained at 15 to 20% by volume, the inorganic filler (H) may be contained at 5 to 10% by volume, each of the inorganic fillers (E) to (H) may have a uniformity coefficient of 2.5 or more in a Rosin-Rammler particle size distribution equation, and one or both of the fillers (E) and (F) may comprise aluminum nitride.

[3] A metal-base circuit board comprises a metal circuit stacked through an insulating layer on a metal plate, and in the metal-base circuit board, the insulating layer may comprise the resin composition for a circuit board according to the aspect [1] or [2].

[4] A luminescent device may comprise the metal-base circuit board according to the aspect [3] and an LED provided on the metal circuit.

Advantageous Effects of Invention

The present invention enables the production of a metal-base circuit board having excellent solder crack resistance, thermal conductivity, adhesive property, and insulation property and of a resin composition for a circuit board used for the metal-base circuit board.

DESCRIPTION OF EMBODIMENTS

Preferred embodiments for carrying out the present invention will now be described. The present invention is not intended to be limited to the following embodiments and may be freely modified within the scope of the invention. Embodiments are not intended to limit the scope of the invention. The present invention will be described in detail hereinbelow.

<1. Resin Composition of Present Invention>

A resin composition of the present invention comprises component (i), a vinylsilyl group-containing polysiloxane and component (ii), a hydrosilyl group-containing polysiloxane.

The vinylsilyl group-containing polysiloxane as the component (i) preferably comprises (A) a dual-end type vinylsilyl group-containing polysiloxane having a weight average molecular weight of 30,000 to 80,000 and (B) a side-chain dual-end type vinylsilyl group-containing polysiloxane having a weight average molecular weight of 100,000 or more.

The mass ratio of (A) to (B), (A)/(B), is preferably 80/20 to 30/70.

The vinylsilyl group-containing polysiloxane as the component (i) preferably has a vinylsilyl group equivalent of 0.01 to 0.035 mol/kg.

The hydrosilyl group-containing polysiloxane as the component (ii) preferably has a hydrosilyl group equivalent of 6 mol/kg or more.

The molar ratio of (C) a hydrosilyl group in the component (i) to (D) a vinylsilyl group in the component (ii), (C)/(D), is preferably 2.5 to 5.0.

By adjusting silicone resin materials to particular weight average molecular weights, a particular mass ratio, particular functional group equivalent weights, and a particular functional group molar ratio, thermal stress generated during heat cycle is capable of relaxed, and high adhesive property (specifically peel strength) between a copper foil and an insulating layer is achieved.

The resin composition of the present invention preferably comprises component (iii), an inorganic filler at 60 to 80% by volume in order to achieve high thermal conductivity. When the inorganic filler has a particular formulation, particular particle sizes, and particular uniformity coefficients in the Rosin-Rammler particle size distribution equation, heat generated in an exothermic electronic component is efficiently dissipated, and high heat dissipation property is achieved.

The resin composition of the present invention is to yield an insulating layer, and satisfactory deformation of the insulating layer reduces the stress of a solder layer. Hence, heat generated in an exothermic electronic component is efficiently dissipated, and high heat dissipation property is achieved.

Conventionally, thermal stress relaxation (reduction in elastic modulus of an insulating layer) and peel strength have a trade-off relationship. In addition, when a filler is densely packed for higher thermal conductivity, the peel strength is further reduced. According to the present invention, material setting of the component (i) and the component (ii) have achieved high peel strength while maintaining heat cycle performance and high thermal conductivity.

The resin composition enables relaxation of the thermal stress (solder crack suppression) during heat cycle and is thought to be excellent in the exothermic electronic component field.

In particular, the car LED headlight field requires suppression of cracks in a solder layer when an exothermic electronic component such as an LED is mounted on a copper circuit. If cracks are formed in a solder layer, an LED may fail to be lightened, and thus the cracks in a solder layer is a critical issue in the car and car part production field. The present invention also provides excellent solder crack resistance and thus is preferably used for car LEDs.

<Silicone Resin>

The curing reaction for a silicone resin includes four types of 1) dehydration condensation reaction between silanol groups (Si—OH), 2) condensation reaction between a silanol group (Si—OH) and a hydrolyzable group (Si—OR, R is an alkoxy group, an acetoxy group, or the like), 3) reaction of a methylsilyl group (Si—CH$_3$) or a vinylsilyl group (Si—CH=CH$_2$) with an organic peroxide, and 4) addition reaction of a vinylsilyl group (Si—CH=CH$_2$) and a hydrosilyl group (Si—H).

For the silicone resin used as a matrix of the insulating layer in a metal-base circuit board, the addition reaction-type 4) of a vinylsilyl group (Si—CH=CH$_2$) and a hydrosilyl group (Si—H) is preferred because no by-product is generated during the reaction.

The silicone resin of the present invention is preferably a mixture comprising component (i), a vinylsilyl group-containing polysiloxane (a dual-end type vinylsilyl group-containing polysiloxane and a side-chain dual-end type vinylsilyl group-containing polysiloxane) and component (ii), a hydrosilyl group-containing polysiloxane.

In the present invention, the "silicone resin having a vinylsilyl group" is also called a "vinyl group-containing polysiloxane".

In the present invention, the "silicone resin having a hydrosilyl group" is also called a "hydrosilyl group-containing polysiloxane".

<Component (i), Vinylsilyl Group-Containing Polysiioxane>

The vinylsilyl group-containing polysiloxane (hereinafter also called "vinyl group-containing polysiloxane") used in the present invention preferably comprises component (A), a dual-end type vinyl group-containing polysiloxane (hereinafter also called "dual-end type vinylsilyl group-containing polysiloxane") having a weight average molecular weight of 30,000 to 80,000 and component (B), a side-chain dual-end type vinylsilyl group-containing polysiloxane (hereinafter also called "side-chain dual-end type vinylsilyl group-containing polysiloxane") having a weight average molecular weight of 100,000 or more.

The dual-end type vinylsilyl group-containing polysiloxane as the component (A) preferably has a weight average molecular weight of 30,000 to 80,000, more preferably 30,000 to 75,000, and even more preferably 40,000 to 70,000.

If the dual-end type vinylsilyl group-containing polysiloxane has a weight average molecular weight of less than 30,000, a resulting silicone resin component is likely to have lower elongation property to give a lower peel strength. If the dual-end type vinylsilyl group-containing polysiloxane has a weight average molecular weight of more than 80,000, a resulting insulating layer is likely to have defects, and the dielectric breakdown strength is likely to be reduced.

As the dual-end type vinylsilyl group-containing polysiloxane as the component (A), a commercial product may be used. Examples of the commercial product include BLUESIL 621V 5000 (manufactured by Bluestar Silicones, a weight average molecular weight of 56,200, a vinylsilyl group equivalent of 0.045 mol/kg); BLUESIL 621V 1000 (manufactured by Bluestar Silicones, a weight average molecular weight of 34,500, a vinylsilyl group equivalent of 0.082 mol/kg); and BLUESIL 621V 10000 (manufactured by Bluestar Silicones, a weight average molecular weight of 72,500, a vinylsilyl group equivalent of 0.036 mol/kg).

The side-chain dual-end type vinylsilyl group-containing polysiloxane as the component (B) preferably has a weight average molecular weight of 100,000 or more, more preferably 120,000 or more, and even more preferably 150,000 or more. The upper limit of the weight average molecular weight is not specifically limited and is preferably 1,000,000 or less in consideration of workability including viscosity.

If the side-chain dual-end type vinylsilyl group-containing polysiloxane has a weight average molecular weight of less than 100,000, a resulting silicone resin component is likely to have lower elongation property to give a lower peel strength.

As the side-chain dual-end type vinylsilyl group-containing polysiloxane as the component (B), a commercial product may be used. Examples of the commercial product include BLUESIL GUM 753 (manufactured by Bluestar Silicones, a weight average molecular weight of 453,200, a vinylsilyl group equivalent of 0.019 mol/kg); BLUESIL 621V 60 000 (manufactured by Bluestar Silicones, a weight average molecular weight of 125,000, a vinylsilyl group equivalent of 0.021 mol/kg); BLUESIL GUM 755 (manufactured by Bluestar Silicones, a weight average molecular weight of 463,200, a vinylsilyl group equivalent of 0.011 mol/kg); and BLUESIL GUM 795 (manufactured by Bluestar Silicones, a weight average molecular weight of 461,500).

Examples of the vinylsilyl group-containing polysiloxane include those represented by General Formulae (a1-1) to (a1-4). Each of m and n is a number not less than 0. Typical examples of the end type and/or side chain-type vinylsilyl group-containing polysiloxane include those represented by General Formula (a1-3) and General Formula (a1-4). The present invention is not intended to be limited to those represented by General Formulae (a1-1) to (a1-4).

[Chemical Formula 1]

(a1-1)

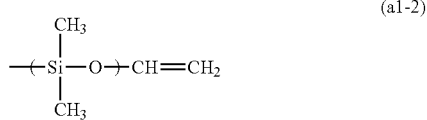

(a1-2)

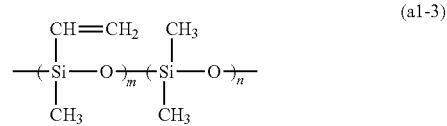

(a1-3)

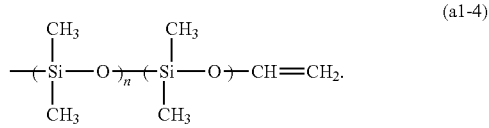

(a1-4)

<Measurement Method of Weight Average Molecular Weight of Vinylsilyl Group-Containing Polysiloxane>

In the present invention, the weight average molecular weight is a weight average molecular weight in terms of polystyrene determined by size exclusion chromatography (hereinafter abbreviated as SEC) (in accordance with JIS K 7252-1: 2016, 3.4.1, equation (1)).

<Vinylsilyl Group Equivalent of Vinyl Group-Containing Polysiloxane>

The vinylsilyl group equivalent of the vinyl group-containing polysiloxane of the present invention ((D)=(A)+(B)) is preferably 0.005 to 0.045 mol/kg, more preferably 0.008 to 0.040 mol/kg, even more preferably 0.01 to 0.035 mol/kg, and particularly preferably 0.015 to 0.030 mol/kg.

If the vinylsilyl group-containing polysiloxane (side-chain dual-end type+dual-end type) has a vinylsilyl group equivalent of more than 0.045 mol/kg, a resulting silicone resin component is likely to have lower elongation property. If the vinylsilyl group-containing polysiloxane has a vinylsilyl group equivalent of less than 0.005 mol/kg, a resulting silicone resin component is likely to have a lower strength. In each case, the peel strength is likely to be reduced.

The side-chain dual-end type vinylsilyl group-containing polysiloxane (B) used in the present invention preferably has a vinylsilyl group equivalent of 0.08 to 0.033 mol/kg, more preferably 0.01 to 0.03 mol/kg, and even more preferably 0.013 to 0.027 mol/kg.

The dual-end type vinylsilyl group-containing polysiloxane (A) used in the present invention may have any vinylsilyl group equivalent, but a dual-end type vinylsilyl group-containing polysiloxane having a weight average molecular weight of 30,000 to 80,000 typically has a vinylsilyl group equivalent of 0.025 to 0.067 mol/kg.

<Measurement Method of Vinylsilyl Group Equivalent of Vinyl Group-Containing Polysiloxane>

In the present invention, the vinylsilyl group equivalent of a vinyl group-containing polysiloxane may be determined by $^1$H-NMR measurement using an internal standard (Riko Miyoshi, Yoko Saiyama, "Trace sample analysis using solid-state high-resolution NMR", Toray Research Center, The TRC News, No. 115, May, 2015).

<Mass Ratio of Dual-End Type Vinylsilyl Group-Containing Polysiloxane (A) to Side-Chain Dual-End Type Vinylsilyl Group-Containing Polysiloxane (B), (A)/(B)>

In the present invention, the mass ratio of the dual-end type vinylsilyl group-containing polysiloxane (A) to the side-chain dual-end type vinylsilyl group-containing polysiloxane (B), (A)/(B), is preferably 80/20 to 30/70, more preferably 76/24 to 32/68, even more preferably 70/30 to 40/60, and particularly preferably 60/40 to 40/60.

If the mass ratio, (A)/(B), is more than 80/20, a resulting silicone resin component is likely to have lower elongation property. If the mass ratio, (A)/(B), is less than 30/70, a resulting silicone resin component is likely to have a lower strength. In each case, the peel strength is likely to be reduced.

<Component (ii), Hydrosilyl Group-Containing Polysiloxane>

The hydrosilyl group-containing polysiloxane used in the present invention is not specifically limited.

As the hydrosilyl group-containing polysiloxane, a commercial product may be used. Examples of the commercial product include WR68 (manufactured by Bluestar Silicones, a hydrosilyl group equivalent of 16 mol/kg) and BLUESIL FLD 626V25H7 (manufactured by Bluestar Silicones, a hydrosilyl group equivalent of 7 mol/kg).

<Hydrosilyl Group Equivalent of Hydrosilyl Group-Containing Polysiloxane>

The hydrosilyl group-containing polysiloxane used in the present invention preferably has a hydrosilyl group equivalent of 6 mol/kg or more and more preferably 8 mol/kg or more, and the upper limit of the hydrosilyl group equivalent is preferably 18 mol/kg or less. If the hydrosilyl group-containing polysiloxane has a hydrosilyl group equivalent of less than 6 mol/kg, a resulting silicone resin component is likely to have lower strength to give a lower peel strength.

<Measurement Method of Hydrosilyl Group Equivalent of Hydrosilyl Group-Containing Polysiloxane>

In the present invention, the hydrosilyl group equivalent may be determined by $^1$H-NMR measurement using an internal standard (Riko Miyoshi, Yoko Saiyama, "Trace sample analysis using solid-state high-resolution NMR", Toray Research Center, The TRC News, No. 115, May, 2015).

<Weight Average Molecular Weight of Hydrosilyl Group-Containing Polysiloxane>

The hydrosilyl group-containing polysiloxane of the present invention may have any weight average molecular weight, but the weight average molecular weight is typically 10,000 or less from the viewpoint of balance with the packing property of the inorganic filler.

<Molar Ratio of (C) Hydrosilyl Group to (D) Vinylsilyl Group, (C)/(D)>

In the present invention, the "molar ratio of (C) a hydrosilyl group to (D) a vinylsilyl group, (C)/(D)" is preferably 2.5 to 5.0, more preferably 2.7 to 4.8, and even more preferably 2.8 to 3.6.

If the ratio is less than 2.5, interfacial peeling is likely to be caused between an insulating layer and a copper foil at the time of peel strength measurement. If the ratio is more than 5.0, a resulting silicone resin component is likely to have a lower strength. In each case, the peel strength is likely to be reduced.

The molar ratio is the ratio of "the molar amount of (C) a hydrosilyl group/the molar amount of (D) a vinylsilyl group".

"The molar amount of (C) a hydrosilyl group" may be calculated from the hydrosilyl group equivalent and the mass of a hydrosilyl group-containing polysiloxane.

"The molar amount of (D) a vinylsilyl group" may be calculated from the vinylsilyl group equivalent and the mass of a vinylsilyl group-containing polysiloxane (containing a dual-end type vinylsilyl group-containing polysiloxane as the component (A) and a side-chain dual-end type vinylsilyl group-containing polysiloxane as the component (B)).

<Additives for Silicone Resin>

The silicone resin of the present invention may appropriately contain a reinforcing filler for improving the resin strength, such as MQ resin and silica, a platinum catalyst or a reaction retardant for controlling the reaction between a hydrosilyl group and a vinylsilyl group, an oxide, hydroxide, carbonate, or aliphatic acid salt of a rare earth element or a metal such as titanium, zirconia, manganese, iron, cobalt, and nickel, for improving the heat resistance, a silane coupling agent for improving the adhesion between the silicone resin and the inorganic filler, and a solvent for adjusting the viscosity, such as toluene and isoparaffin. Of the solvents, isoparaffin is preferred.

In the resin composition of the present invention, the total amount of the silicone resin composition and the inorganic filler is 100% by volume, and the silicone resin composition may contain additives for the silicone resin. For example, the amount of the platinum catalyst is preferably 0.01 to 0.1 part by mass, and the amount of the reaction retardant (hereinafter also called retardant) is preferably 0.01 to 0.1 part by mass, relative to 100 parts by mass of the silicone resin. The amount of the solvent is preferably 1 to 30 parts by mass relative to 100 parts by mass of the total of the silicone resin and the inorganic filler.

<Inorganic Filler>

In the present invention, the inorganic filler is not specifically limited, and examples include aluminum oxide, magnesium oxide, boron nitride, aluminum nitride, silicon nitride, silicon carbide, metallic aluminum, and graphite from the viewpoint of thermal conductivity. These fillers may be used singly or in combination of two or more of them. These fillers may be commercial products. Of the inorganic fillers, aluminum oxide and/or aluminum nitride is preferred.

Specifically, aluminum oxide, which exhibits high thermal conductivity and satisfactory packing property in a resin, is preferred. For (E) an inorganic filler having an average particle size of 20 to 55 μm, aluminum nitride is preferably used.

The inorganic filler used in the present invention may be any type, such as a hexagonal crystal type or a spherical type, and is preferably a spherical type (preferably having a sphericity of 0.85 or more).

<% by Volume of Inorganic Filler>

In the present invention, the inorganic filler is preferably contained at 60 to 80% by volume, more preferably 63% by volume or more, and even more preferably 65 to 78% by volume. If the content is less than 60% by volume, the thermal conductivity may be reduced. If the content is more than 80% by volume, a resulting insulating layer is likely to have defects, and the dielectric breakdown strength and the peel strength are likely to be reduced.

<Average Particle Size and Type of Inorganic Filler>

The inorganic filler preferably has various average particle sizes including (E) an inorganic filler having an average particle size of 35 to 55 μm, (F) an inorganic filler having an average particle size of 20 to 30 μm, (G) an inorganic filler having an average particle size of 8 to 18 μm, and (H) an inorganic filler having an average particle size of 0.3 to 5 μm. The resin composition of the present invention comprises the inorganic fillers (E) to (H) having various average particle sizes, and thus a high dielectric breakdown strength, a high thermal conductivity, and a high peel strength are compatible. As described above, a combination of the inorganic fillers having various average particle sizes is also important in improving effects in the present invention.

Examples of the inorganic filler used as the inorganic fillers (E) to (H) having various average particle sizes include the above-mentioned aluminum oxide and aluminum nitride. Of them, aluminum oxide and/or aluminum nitride is preferably used, and aluminum oxide is more preferably used.

One or both of the inorganic filler (E) having an average particle size of 35 to 55 μm and the inorganic filler (F) having an average particle size of 20 to 30 μm are preferably aluminum nitride.

In order to achieve a high thermal conductivity in the present invention, it is also important to improve the thermal conductivity of the inorganic filler itself. In particular, the thermal conductivity of an inorganic filler itself having a large average particle size greatly contributes to the thermal conductivity of an insulating layer and thus has an advantageous effect.

<% by Volume of Inorganic Fillers>

As for the % by volume of various inorganic fillers of the present invention, the inorganic filler (E) is preferably contained at 25 to 30% by volume, the inorganic filler (F) is preferably contained at 15 to 20% by volume, the inorganic filler (G) is preferably contained at 15 to 20% by volume, and the inorganic filler (H) is preferably contained at 5 to 10% by volume, in the resin composition of the present invention.

If the inorganic filler (E) is contained at more than 30% by volume, the peel strength is likely to be reduced. If the inorganic filler (E) is contained at less than 25% by volume, the thermal conductivity is likely to be reduced.

If the inorganic filler (F) is contained at more than 20% by volume, the peel strength is likely to be reduced. If the inorganic filler (F) is contained at less than 15% by volume, the thermal conductivity is likely to be reduced.

If the inorganic filler (G) is contained at more than 20% by volume, the dielectric breakdown strength is likely to be reduced. If the inorganic filler (G) is contained at less than 15% by volume, the thermal conductivity is likely to be reduced.

If the inorganic filler (H) is contained at more than 10% by volume, the dielectric breakdown strength is likely to be reduced. If the inorganic filler (H) is contained at less than 5% by volume, the peel strength is likely to be reduced.

<Measurement Method of Average Particle Size>

The average particle size is a particle size at a cumulative value of 50% on a cumulative particle size distribution in particle size distribution measurement by laser diffraction scattering method.

The average particle size may be determined with, for example, "MT3300EX" (manufactured by NIKKISO CO., LTD.). For the measurement, water was used as the solvent, and hexametaphosphoric acid was used as the dispersant. A sample was dispersed as a pretreatment using an ultrasonic homogenizer at an output power of 20 W for 60 seconds. The refractive index of water was 1.33, and the refractive index of a boron nitride powder was 1.80. The measurement time is 30 seconds for a single measurement.

<Uniformity Coefficient in Rosin-Rammler Particle Size Distribution Equation>

Each of the inorganic fillers (E) to (H) of the present invention preferably has a uniformity coefficient of 2.5 or more in the Rosin-Rammler particle size distribution equation.

If having a uniformity coefficient of less than 2.5, the inorganic filler is difficult to be densely packed in the silicone resin composition, and the thermal conductivity is likely to be reduced.

<Measurement Method of Uniformity Coefficient in Rosin-Rammler Particle Size Distribution Equation>

The uniformity coefficient may be determined with, for example, "MT3300EX" (manufactured by NIKKISO CO., LTD.). For the measurement, water was used as the solvent, and hexametaphosphoric acid was used as the dispersant. A sample was dispersed as a pretreatment using an ultrasonic homogenizer at an output power of 20 W for 60 seconds. The refractive index of water was 1.33, and the refractive index of a boron nitride powder was 1.80. The measurement time is 30 seconds for a single measurement.

<Resin Composition for Circuit Board, Insulating Layer, and Metal-Base Circuit Board of Present Invention>

A resin composition for a circuit board of the present invention is a composition prepared by adding, to the silicone resin and the inorganic filler, the above-mentioned reinforcing filler, the platinum catalyst or reaction retardant, the solvent, and the like.

The resin composition for a circuit board of the present invention may be formed into an insulating layer (thermal-conductive insulating adhesive sheet).

A metal-base circuit board of the present invention may be produced by stacking a metal circuit having a predetermined circuit pattern for providing an electronic component, through an insulating layer comprising the resin composition for a circuit board, on a metal plate.

<Metal Plate>

The material of the metal plate may be any metal plate material usable in a metal-base circuit board, and examples include copper, aluminum, silver, and gold. Of them, silver, gold, and the like are usable in consideration of only characteristics, but copper or aluminum is preferred from the viewpoint of thermal conductivity and price.

The metal plate preferably has a plate thickness of 0.14 to 5.0 mm and more preferably 0.3 to 3.0 mm. If the plate thickness is less than 0.14 mm, the strength as the circuit board is insufficient, thus cracking, chipping, warpage, or the like is likely to be caused in a mounting process of an electronic component, and such a condition is unfavorable. If the plate thickness is more than 5.0 mm, the metal plate itself has a large heat resistance, thus a resulting circuit board has lower heat dissipation property, and such a condition is unfavorable.

<Metal Circuit>

The material of the metal circuit may be any material usable in a metal circuit, and examples include copper, aluminum, silver, and gold. Of them, copper or aluminum is preferred from the viewpoint of electrical conductivity and thermal conductivity. Silver, gold, or the like is usable in consideration of only characteristics, but copper or aluminum is preferred in consideration of price, subsequent circuit formation, and the like.

The metal circuit preferably has a plate thickness of 0.018 to 0.5 mm and more preferably 0.035 to 0.3 mm. If a metal circuit having a plate thickness of less than 0.018 mm is used in a circuit board or a multi-layered circuit board, sufficient electrical conductivity or electric conductivity is failed to be achieved to cause problems including heat generation of the metal circuit part, and such a condition is unfavorable. If the plate thickness is more than 0.5 mm, the metal circuit itself has a large heat resistance, thus a resulting circuit board or a multi-layered circuit board has lower heat dissipation property, and such a condition is unfavorable.

<Adhesion Faces of Metal Plate and Metal Circuit>

In order to improve adhesive property of an insulating layer (thermal-conductive insulating adhesive sheet) to a metal plate and a metal circuit, each adhesion face of the metal plate and the metal circuit to the insulating layer (thermal-conductive insulating adhesive sheet) is preferably subjected to surface treatment such as detailing treatment, sandblasting, etching, various plating processes, and primer treatment with a silane coupling agent.

Each adhesion face of the metal plate and the metal circuit to the thermal-conductive insulating adhesive sheet preferably has a surface roughness of 0.1 to 15 µm, more preferably 0.5 to 12 µm, and even more preferably 1.0 to 10 µm, in terms of ten-point average roughness (Rz, JIS B0601: 1994). If having a surface roughness of less than 0.1 µm, the adhesion face is difficult to have sufficient adhesive property to the thermal-conductive insulating adhesive sheet. If having a surface roughness of more than 15 µm, the adhesion face is likely to have defects, and thus the dielectric breakdown strength is likely to be reduced, or the adhesive property is likely to be reduced.

The ten-point average roughness Rz may be determined by using a contact type surface roughness meter, for example, "SEF 580-G18" (manufactured by Kosaka Laboratory Ltd.).

<Formation Method of Metal Circuit>

As an example method of forming a predetermined circuit pattern of a metal circuit, a metal foil is stacked on an insulating layer, next on the surface of the metal foil, an etching resist is formed in the shape of the circuit pattern, etching is performed using an aqueous cupric chloride solution or the like to remove unnecessary metal portions, then the etching resist is released with an aqueous alkali solution or the like, and consequently a metal circuit is formed.

After formation of the circuit pattern, Ni plating, Ni alloy plating, preflux treatment, or the like may be performed on the metal circuit as needed. A solder resist may be formed on the metal circuit and the insulating layer as needed.

<Luminescent Device Having LED>

A luminescent device having an LED of the present invention may be produced by joining/providing an LED element with a solder on a metal circuit of a metal-base circuit board comprising the resin composition for a circuit board as the insulating layer. This enables dissipation of heat generated by the LED element to suppress the temperature increase of the LED element, and characteristics are prevented from deteriorating. Even when the temperature in a usage environment greatly changes, this structure enables relaxation of the thermal stress. Hence, an LED element is prevented from causing lightning fault that is caused by conduction failure due to solder cracks.

EXAMPLES

The present invention will next be described more specifically with reference to examples and comparative examples, which will be described for better understanding of the present invention and advantages thereof but are not intended to limit the present invention.

Examples 1 to 13, Comparative Examples 1 to 15

<Resin Composition for Circuit Board>

Resin compositions for a circuit board to form an insulating layer were prepared by the following procedure. Silicone resins, inorganic fillers, and additives were weighed in accordance with formulations shown in Tables 1 to 3 and were stirred and mixed with a planetary centrifugal mixer, "THINKY MIXER ARE-310" (THINKY) at 2,000 rpm for 3 minutes, giving resin compositions for a circuit board.

<Silicone Resin> (A) Dual-End Type Vinylsilyl Group-Containing Polysiloxane

A-1: BLUESIL 621V 5000 (Bluestar Silicones), weight average molecular weight: 56,200

A-2: BLUESIL 621V 1000 (Bluestar Silicones), weight average molecular weight: 34,500

A-3: BLUESIL 621V 10000 (Bluestar Silicones), weight average molecular weight: 72,500

A-4: BLUESIL 621V 600 (Bluestar Silicones), weight average molecular weight: 28,500

A-5: BLUESIL 621V 20 000 (Bluestar Silicones), weight average molecular weight: 92,000

<Silicone Resin> (B) Side-Chain Dual-End Type Vinylsilyl Group-Containing Polysiloxane B-1: BLUESIL GUM 753 (Bluestar Silicones), weight average molecular weight: 453,200

B-2: BLUESIL 621V 60 000 (Bluestar Silicones), weight average molecular weight: 125,000

B-3: BLUESIL GUM 755 (Bluestar Silicones), weight average molecular weight: 463,200

B-4: BLUESIL GUM 795 (Bluestar Silicones), weight average molecular weight: 461,500

B-5: BLUESIL 621V 20 000 (Bluestar Silicones), weight average molecular weight: 92,000

B-6: BLUESIL GUM 703 (Bluestar Silicones), weight average molecular weight: 443,200

B-7: BLUESIL GUM 759 (Bluestar Silicones), weight average molecular weight: 471,300

<Silicone Resin> (C) Hydrosilyl Group-Containing Polysiloxane

C-1: WR68 (Bluestar Silicones), weight average molecular weight: 8,200

C-2: BLUESIL FLD 626V25H7 (Bluestar Silicones)

C-3: BLUESIL FLD 628V270H4.6 (Bluestar Silicones)

<Additive> (X) Platinum Catalyst

X-1: SILCOLEASE CATALYST 12070 (Bluestar Silicones), amount (phr): 0.08, *relative to silicone resin <Additive> (Y) Retardant Y-1: BLUESIL RTRD PA 40 (Bluestar Silicones), amount (phr): 0.09, *relative to silicone resin <Additive> (Z) Solvent Z-1: IP Clean LX (Idemitsu Kosan Co., Ltd.), an isoparaffin solvent, amount (parts by mass): 15, *relative to the total amount of silicone resins and inorganic fillers <Inorganic filler> (E) Inorganic filler, DAS45 (Denka), aluminum oxide, spherical, average particle size (μm): 45

<Inorganic filler> (F) Inorganic filler, AlN32 (Denka), aluminum nitride, spherical, average particle size (μm): 24

<Inorganic filler> (G) Inorganic filler, DAS10 (Denka), aluminum oxide, spherical, average particle size (μm): 9

<Inorganic filler> (H) Inorganic filler, DAW03 (Denka), aluminum oxide, spherical, average particle size (μm): 3.4

Comparative Examples 13 to 15

Silicone resin (component A), TSE3033 A (Momentive)

Silicone resin (component A), XE-14B2324 A (Momentive)

Silicone resin (component A), TSE3033A (Momentive)/XE-14B2324 A (Momentive)

Silicone resin (component B), TSE3033B (Momentive)

Silicone resin (component B), XE-14B2324B (Momentive)

Silicone resin (component B), TSE3033B (Momentive)/XE-14B2324B (Momentive) Additive: Solvent, IP Clean LX (Idemitsu Kosan Co., Ltd.), amount (parts by mass): 15, *relative to silicone resins and inorganic fillers (G) Inorganic filler, DAW-10 (Denka), aluminum oxide, average particle size (μm): 10.5

(H) Inorganic filler, AO-502 (Admatechs), aluminum oxide, average particle size (μm): 0.8

<Original Plate>

A prepared resin composition for a circuit board was applied onto an aluminum plate (1050 manufactured by Showa Denko) having a thickness of 1.5 mm by screen printing so as to give a thickness of 100 μm after solvent drying, giving an insulating layer. Onto the insulating layer, a copper foil (GTS-MP manufactured by Furukawa Circuit Foil) having a thickness of 70 μm was bonded as a metal foil, then the whole was heated at 180° C. for 3 hours to thermally cure the silicone resin in the insulating layer, giving an original plate.

<Evaluation>

The vinylsilyl group equivalent and the weight average molecular weight of a vinylsilyl group-containing polysiloxane and the hydrosilyl group equivalent and the weight average molecular weight of a hydrosilyl group-containing polysiloxane used in a resin composition for a circuit board were determined by the following procedures.

The dielectric breakdown strength, the thermal conductivity, the peel strength, and the solder crack resistance of the prepared original plate were also evaluated by the following procedures. The obtained results are shown in Tables 1 to 3.

<Vinylsilyl Group Equivalent and Hydrosilyl Group Equivalent>

The vinylsilyl group equivalent of a vinylsilyl group-containing polysiloxane and the hydrosilyl group equivalent of a hydrosilyl group-containing polysiloxane were determined in accordance with the method described above by $^1$H-NMR in the following conditions.

Apparatus: ECP-300 NMR system manufactured by JEOL Ltd.

Internal standard: deuterated chloroform ($CDCl_3$)

Solvent: deuterated chloroform ($CDCl_3$)

Scan: 128

Measurement nucleus: 1H

<Weight Average Molecular Weight>

The weight average molecular weight of a vinylsilyl group-containing polysiloxane was determined in accordance with the method described above by SEC in the following conditions.

Dissolving condition: dissolving 0.03 g of a measurement sample in 10 ml of THF

Filter condition: filtered through a membrane filter having a pore size of 0.45 μm Deaerator: ERC-3315 manufactured by ERC Pump: PU-980 manufactured by JASCO Corporation Flow rate: 1.0 ml/min Autosampler: AS-8020 manufactured by Tosoh Corporation Column oven: L-5030 manufactured by Hitachi, Ltd.

Set temperature: 40° C.

Column constitution: two pieces of TSK guard column MP (XL) 6.0 mm ID×4.0 cm manufactured by Tosoh Corporation, two pieces of TSK-GELMULTIPORE HXL-M 7.8 mm ID×30.0 cm manufactured by Tosoh Corporation, four pieces in total Detector: RI, L-3350 manufactured by Hitachi, Ltd.

Data processing: SIC480 Data Station

<Evaluation Method of Dielectric Breakdown Strength>

A predetermined position on the copper foil face of the original plate was masked with an etching resist in a round shape having a diameter of 20 mm. Next, the copper foil was etched with an aqueous cupric chloride solution to form a circular copper circuit having a diameter of 20 mm on the copper foil face of the original plate. Then, the etching resist was removed to prepare a metal-base circuit board for dielectric breakdown strength evaluation.

The metal-base circuit board was immersed in an insulation oil, then an alternating voltage was applied between the copper circuit and the aluminum plate at room temperature, and the dielectric breakdown strength was determined in accordance with JIS C 2110-1: 2010. The measurement apparatus used was "TOS-8700" (manufactured by Kikusui Electronics Corp.).

[Evaluation of dielectric breakdown strength] less than 20 kV/mm, failure; 20 to 30 kV/mm, fair; 30 kV/mm or more, good.

<Evaluation Method of Thermal Conductivity>

The thermal conductivity of the insulating layer was determined with a cured product having a thickness of 1 mm prepared by curing a resin composition for a circuit board at 150° C. for 1 hour, in accordance with JIS C 2141-1992. The measurement apparatus used was "LFA 447 Nanoflash" (manufactured by NETZSCH).

[Evaluation of thermal conductivity] less than 3.0 W/mK, failure; 3.5 to 4.0 W/mK, fair; 4.0 W/mK or more, good.

<Evaluation Method of Peel Strength>

A predetermined position on the copper foil face of the original plate was masked with an etching resist in a rectangular shape having a width of 10 mm and a length of 100 mm. Next, the copper foil was etched with an aqueous cupric chloride solution to form a rectangular copper circuit having a width of 10 mm and a length of 100 mm on the copper foil face of the original plate. Then, the etching resist was removed to prepare a metal-base circuit board for peel strength evaluation.

The peel strength was determined in accordance with JIS C 6481-1996. The measurement apparatus used was "Tensilon RTG1210" (manufactured by A&D). [Evaluation of peel strength] less than 8.0N/cm, failure; 8.0 to 10.0N/cm, fair; 10.0N/cm or more, good.

<Evaluation of Solder Crack Resistance>

A predetermined position on the copper foil face of the original plate was masked with an etching resist, and the copper foil was etched with an aqueous cupric chloride solution. Next, the etching resist was removed to form a predetermined metal circuit pattern. Then, a liquid solder resist was applied onto the insulating layer and the metal circuit and was cured by heat and ultraviolet light to form a solder resist layer, giving a metal-base circuit board for solder crack resistance evaluation.

On the metal circuit, an LED, "NSSW063A" (manufactured by Nichia Corporation) was provided with a tin-silver-copper lead-free solder, "ECO SOLDER M705" (manufactured by Senju Metal Industry). The metal-base circuit board with the LED was subjected to air chamber-type thermal shock test at −40° C. to +125° C. (each 20 minutes) 8,000 cycles. A cross section of the solder joined portion after thermal shock test was observed under a microscope to determine crack generation, and evaluation was performed in accordance with the following criteria.

○ (acceptance); a crack length is less than 80% of the total length of the solder joined portion.

x (failure); a crack length is 80% or more of the total length of the solder joined portion.

TABLE 1

| | Item | | Example 1 | Example 2 | Example 3 | Example 4 | Example 5 | Example 6 | Example 7 | Example 8 | Example 9 | Example 10 | Example 11 | Example 12 | Example 13 |
|---|---|---|---|---|---|---|---|---|---|---|---|---|---|---|---|
| Silicone resin | (A) Dual-end type vinylsilyl group-containing polysiloxane | Type | A-1 | A-2 | A-3 | A-1 | A-1 | A-1 | A-1 | A-1 | A-1 | A-1 | A-1 | A-1 | A-1 |
| | | Weight average molecular weight | 56200 | 34500 | 72500 | 56200 | 56200 | 56200 | 56200 | 56200 | 56200 | 56200 | 56200 | 56200 | 56200 |
| | (B) Side-chain dual-end type vinylsilyl group containing polysiloxane | Type | B-1 | B-1 | B-1 | B-2 | B-3 | B-4 | B-1 | B-1 | B-1 | B-1 | B-1 | B-1 | B-1 |
| | | Weight average molecular weight | 453200 | 453200 | 453200 | 125000 | 463200 | 461500 | 453200 | 453200 | 453200 | 453200 | 453200 | 453200 | 453200 |
| | (D) [(A) + (B), vinylsilyl group equivalent (mol/kg)] | | 0.019 | 0.019 | 0.019 | 0.021 | 0.011 | 0.033 | 0.019 | 0.019 | 0.019 | 0.019 | 0.019 | 0.019 | 0.019 |
| | (C) Hydrosilyl group-containing polysiloxane | Type | C-1 | C-1 | C-1 | C-1 | C-1 | C-1 | C-2 | C-1 | C-1 | C-1 | C-1 | C-1 | C-1 |
| | | Hydrosilyl group equivalent (mol/kg) | 16 | 16 | 16 | 16 | 16 | 1.6 | 7 | 16 | 16 | 16 | 16 | 16 | 16 |
| | Mass ratio of (A) to (B), (A)/(B) | | 50/50 | 50/50 | 50/50 | 50/50 | 50/50 | 50/50 | 50/50 | 76/24 | 32/68 | 50/50 | 50/50 | 50/50 | 50/50 |
| | Molar ratio of (C) hydrosilyl group to (D) vinylsilyl group, (C)/(D) | | 3.2 | 3.2 | 3.2 | 3.2 | 3.2 | 3.2 | 3.2 | 3.2 | 3.2 | 2.7 | 4.8 | 3.2 | 3.2 |
| Additive | (X) Platinum catalyst | Type | X-1 | X-1 | X-1 | X-1 | X-1 | X-1 | X-1 | X-1 | X-1 | X-1 | X-1 | X-1 | X-1 |
| | | Amount (phr) *relative to silicone resin | 0.08 | 0.08 | 0.08 | 0.08 | 0.08 | 0.08 | 0.08 | 0.08 | 0.08 | 0.08 | 0.08 | 0.08 | 0.08 |
| | (Y) Retardant | Type | Y-1 | Y-1 | Y-1 | Y-1 | Y-1 | Y-1 | Y-1 | Y-1 | Y-1 | Y-1 | Y-1 | Y-1 | Y-1 |
| | | Amount (phr) *relative to silicone resin | 0.09 | 0.09 | 0.09 | 0.09 | 0.09 | 0.09 | 0.09 | 0.09 | 0.09 | 0.09 | 0.09 | 0.09 | 0.09 |
| | (Z) Solvent | Type | Z-1 | Z-1 | Z-1 | Z-1 | Z-1 | Z-1 | Z-1 | Z-1 | Z-1 | Z-1 | Z-1 | Z-1 | Z-1 |
| | | Amount (parts by mass) *relative to total amount of silicone resins and inorganic fillers | 15 | 15 | 15 | 15 | 15 | 15 | 15 | 15 | 15 | 15 | 15 | 15 | 15 |
| Inorganic filler | Total content of (E) to (H) (% by volume) | | 72 | 72 | 72 | 72 | 72 | 72 | 72 | 72 | 72 | 72 | 72 | 63 | 78 |
| | (E) Inorganic filler (aluminum oxide) | Type | DAS45 | DAS45 | DAS45 | DAS45 | DAS45 | DAS45 | DAS45 | DAS45 | DAS45 | DAS45 | DAS45 | DAS45 | DAS45 |
| | | Average particle size (μm) | 45 | 45 | 45 | 45 | 45 | 45 | 45 | 45 | 45 | 45 | 45 | 45 | 45 |
| | | Content (% by volume) | 28 | 28 | 28 | 28 | 28 | 28 | 28 | 28 | 28 | 28 | 28 | 26 | 29 |
| | (F) Inorganic filler (aluminum nitride) | Type | AlN32 | AlN32 | AlN32 | AlN32 | AlN32 | AlN32 | AlN32 | AlN32 | AlN32 | AlN32 | AlN32 | AlN32 | AlN32 |
| | | Average particle size (μm) | 24 | 24 | 24 | 24 | 24 | 24 | 24 | 24 | 24 | 24 | 24 | 24 | 24 |
| | | Content (% by volume) | 18 | 18 | 18 | 18 | 18 | 18 | 18 | 18 | 18 | 18 | 18 | 16 | 20 |

TABLE 1-continued

| Item | | Example 1 | Example 2 | Example 3 | Example 4 | Example 5 | Example 6 | Example 7 | Example 8 | Example 9 | Example 10 | Example 11 | Example 12 | Example 13 |
|---|---|---|---|---|---|---|---|---|---|---|---|---|---|---|
| (G) Inorganic filler (aluminum oxide) | Type | DAS10 | DAS10 | DAS10 | DAS10 | DAS10 | DAS10 | DAS10 | DAS10 | DAS10 | DAS10 | DAS10 | DAS10 | DAS10 |
| | Average particle size (μm) | 9 | 9 | 9 | 9 | 9 | 9 | 9 | 9 | 9 | 9 | 9 | 9 | 9 |
| | Content (% by volume) | 18 | 18 | 18 | 18 | 18 | 18 | 18 | 18 | 18 | 18 | 18 | 16 | 19 |
| (H) Inorganic filler (aluminum oxide) | Type | DAW03 | DAW03 | DAW03 | DAW03 | DAW03 | DAW03 | DAW03 | DAW03 | DAW03 | DAW03 | DAW03 | DAW03 | DAW03 |
| | Average particle size (μm) | 3.4 | 3.4 | 3.4 | 3.4 | 3.4 | 3.4 | 3.4 | 3.4 | 3.4 | 3.4 | 3.4 | 3.4 | 3.4 |
| | Content (% by volume) | 8 | 8 | 8 | 8 | 8 | 8 | 8 | 8 | 8 | 8 | 8 | 5 | 10 |
| Uniformity Coefficient in Rosin-Rammler particle size distribution equation of (E) to (H) | | 3.2 | 3.2 | 3.2 | 3.2 | 3.2 | 3.2 | 3.2 | 3.2 | 3.2 | 3.2 | 3.2 | 3.2 | 3.2 |
| Evaluation | Dielectric breakdown strength (kV/mm) | 34 | 35 | 33 | 34 | 34 | 35 | 34 | 36 | 33 | 35 | 34 | 34 | 34 |
| | Thermal conductivity (W/mK) | 4.7 | 4.6 | 4.5 | 4.7 | 4.6 | 4.5 | 4.7 | 4.5 | 4.6 | 4.5 | 4.6 | 4.2 | 4.9 |
| | Peel strength (N/cm) | 11.6 | 11 | 11.5 | 10.9 | 10.8 | 11.1 | 10.5 | 11.1 | 10.8 | 11.2 | 10.6 | 11.9 | 10.4 |
| | Solder crack resistance | ○ | ○ | ○ | ○ | ○ | ○ | ○ | ○ | ○ | ○ | ○ | ○ | ○ |

TABLE 2

| Item | | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 | Comparative Example 11 | Comparative Example 12 |
|---|---|---|---|---|---|---|---|---|---|---|---|---|---|
| Silicone resin | (A) Dual-end type vinylsilyl group-containing polysiloxane Type | A-4 | A-5 | A-1 | A-1 | A-1 | A-1 | A-1 | A-1 | A-1 | A-1 | A-1 | A-1 |
| | Weight average molecular weight | 28500 | 92000 | 56200 | 56200 | 56200 | 56200 | 56200 | 56200 | 56200 | 56200 | 56200 | 56200 |
| | (B) Side-chain dual-end type vinylsilyl group-containing polysiloxane Type | B-1 | B-1 | B-5 | B-6 | B-7 | B-1 | B-1 | B-1 | B-1 | B-1 | B-1 | B-1 |
| | Weight average molecular weight | 453200 | 453200 | 92000 | 443200 | 471300 | 453200 | 453200 | 453200 | 453200 | 453200 | 453200 | 453200 |
| | (D) [(A) + (B), vinylsilyl group equivalent (mol/kg)] | 0.019 | 0.019 | 0.028 | 0.4 | 0.004 | 0.019 | 0.019 | 0.019 | 0.019 | 0.019 | 0.019 | 0.019 |
| | (C) Hydrosilyl group-containing polysiloxane Type | C-1 | C-1 | C-1 | C-1 | C-1 | C-3 | C-1 | C-1 | C-1 | C-1 | C-1 | C-1 |
| | Hydrosilyl group equivalent (mol/kg) | 16 | 16 | 16 | 16 | 16 | 4.6 | 16 | 16 | 16 | 16 | 16 | 16 |
| | Mass ratio of (A) to (B), (A)/(B) | 50/50 | 50/50 | 50/50 | 50/50 | 50/50 | 50/50 | 83/17 | 26/74 | 50/50 | 50/50 | 50/50 | 50/50 |
| | Molar ratio of (C) hydrosilyl group to (D) vinylsilyl group, (C)/(D) | 3.2 | 3.2 | 3.2 | 3.2 | 3.2 | 3.2 | 3.2 | 3.2 | 2.3 | 5.3 | 3.2 | 3.2 |
| Additive | (X) Platinum catalyst Type | X-1 | X-1 | X-1 | X-1 | X-1 | X-1 | X-1 | X-1 | X-1 | X-1 | X-1 | X-1 |
| | Amount (phr) *relative to silicone resin | 0.08 | 0.08 | 0.08 | 0.08 | 0.08 | 0.08 | 0.08 | 0.08 | 0.08 | 0.08 | 0.08 | 0.08 |
| | (Y) Retardant Type | Y-1 | Y-1 | Y-1 | Y-1 | Y-1 | Y-1 | Y-1 | Y-1 | Y-1 | Y-1 | Y-1 | Y-1 |
| | Amount (phr) *relative to silicone resin | 0.09 | 0.09 | 0.09 | 0.09 | 0.09 | 0.09 | 0.09 | 0.09 | 0.09 | 0.09 | 0.09 | 0.09 |
| | (Z) Solvent Type | Z-1 | Z-1 | Z-1 | Z-1 | Z-1 | Z-1 | Z-1 | Z-1 | Z-1 | Z-1 | Z-1 | Z-1 |
| | Amount (parts by mass) *relative to total amount of silicone resins and inorganic fillers | 15 | 15 | 15 | 15 | 15 | 15 | 15 | 15 | 15 | 15 | 15 | 15 |
| Inorganic filler | Total content of (E) to (H) (% by volume) | 72 | 72 | 72 | 72 | 72 | 72 | 72 | 72 | 72 | 72 | 56 | 84 |

TABLE 2-continued

| Item | | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 | Comparative Example 11 | Comparative Example 12 |
|---|---|---|---|---|---|---|---|---|---|---|---|---|---|
| (E) Inorganic filler (aluminum oxide) | Type | DAS45 | DAS45 | DAS45 | DAS45 | DAS45 | DAS45 | DAS45 | DAS45 | DAS45 | DAS45 | DAS45 | DAS45 |
| | Average particle size (μm) | 45 | 45 | 45 | 45 | 45 | 45 | 45 | 45 | 45 | 45 | 45 | 45 |
| | Content (% by volume) | 28 | 28 | 28 | 28 | 28 | 28 | 28 | 28 | 28 | 28 | 22 | 32 |
| (F) Inorganic filler (aluminum nitride) | Type | AlN32 | AlN32 | AlN32 | AlN32 | AlN32 | AlN32 | AlN32 | AlN32 | AlN32 | AlN32 | AlN32 | AlN32 |
| | Average particle size (μm) | 24 | 24 | 24 | 24 | 24 | 24 | 24 | 24 | 24 | 24 | 24 | 24 |
| | Content (% by volume) | 18 | 18 | 18 | 18 | 18 | 18 | 18 | 18 | 18 | 18 | 14 | 21 |
| (G) Inorganic filler (aluminum oxide) | Type | DAS10 | DAS10 | DAS10 | DAS10 | DAS10 | DAS10 | DAS10 | DAS10 | DAS10 | DAS10 | DAS10 | DAS10 |
| | Average particle size (μm) | 9 | 9 | 9 | 9 | 9 | 9 | 9 | 9 | 9 | 9 | 9 | 9 |
| | Content (% by volume) | 18 | 18 | 18 | 18 | 18 | 18 | 18 | 18 | 18 | 18 | 14 | 21 |
| (H) Inorganic filler (aluminum oxide) | Type | DAW03 | DAW03 | DAW03 | DAW03 | DAW03 | DAW03 | DAW03 | DAW03 | DAW03 | DAW03 | DAW03 | DAW03 |
| | Average particle size (μm) | 3.4 | 3.4 | 3.4 | 3.4 | 3.4 | 3.4 | 3.4 | 3.4 | 3.4 | 3.4 | 3.4 | 3.4 |
| | Content (% by volume) | 8 | 8 | 8 | 8 | 8 | 8 | 8 | 8 | 8 | 8 | 6 | 10 |
| Uniformity Coefficient in Rosin-Rammler particle size distribution equation of (E) to (H) | | 3.2 | 3.2 | 3.2 | 3.2 | 3.2 | 3.2 | 3.2 | 3.2 | 3.2 | 3.2 | 3.2 | 3.2 |
| Evaluation | Dielectric breakdown strength (kV/mm) | 30 | 18 | 34 | 33 | 35 | 33 | 34 | 31 | 35 | 29 | 37 | 23 |
| | Thermal conductivity (W/mK) | 4.1 | 4.5 | 4.7 | 4.5 | 4.6 | 4.2 | 4.7 | 4.1 | 4.4 | 4.5 | 2.8 | 5 |
| | Peel strength (N/cm) | 7.1 | 11.5 | 6.7 | 5.7 | 6.1 | 7.3 | 5.3 | 7.1 | 6.5 | 6.9 | 12 | 4.9 |
| | Solder crack resistance | x | ○ | x | ○ | ○ | ○ | x | ○ | ○ | ○ | ○ | x |

TABLE 3

| Item | | | Comparative Example 13 | Comparative Example 14 | Comparative Example 15 |
|---|---|---|---|---|---|
| Silicone resin | Silicone resin (component A) | Type | TSE3033 A | XE-14B2324 A | TSE3033 A/ XE-14B2324 A |
| | | Mass ratio | — | — | 25/75 |
| | Silicone resin (component B) | Type | TSE3033B | XE-14B2324 B | TSE3033 B/ XE-14B2324 B |
| | | Mass ratio | — | — | 25/75 |
| | Crosslinking agent (phr*) relative to total amount of component A and component B as silicone resins | | 2 | 2 | 2 |
| | Molar ratio of (C) hydrosilyl group to (D) vinylsilyl group, (C)/(D) | | 2.4 | 2.3 | 2.3 |
| Additive | Solvent | Type | Z-1 | Z-1 | Z-1 |
| | | Amount (parts by mass) *relative to total amount of silicone resins and inorganic | 15 | 15 | 15 |
| Inorganic filler | Total content of (G) to (H) (% by volume) | | 70 | 70 | 70 |
| | (G) Inorganic filler (aluminum oxide) | Type | DAW-10 | DAW-10 | DAW-10 |
| | | Average particle size (μm) | 10.5 | 10.5 | 10.5 |
| | | Content (% by volume) | 49 | 49 | 49 |
| | (H) Inorganic filler (aluminum oxide) | Type (manufacturer) | AO-502 | AO-502 | AO-502 |
| | | Average particle size (μm) | 0.8 | 0.8 | 0.8 |
| | | Content (% by volume) | 21 | 21 | 21 |
| Evaluation | Dielectric breakdown strength (kV/mm) | | 31 | 32 | 30 |
| | Thermal conductivity (W/mK) | | 3.2 | 3.1 | 3.2 |
| | Peel strength (N/cm) | | 5.9 | 7.9 | 8.1 |
| | Solder crack resistance | | ○ | ○ | ○ |

The crosslinking agent used was RD-1 (Dow Corning Toray Co., Ltd., SiH functional siloxane).

INDUSTRIAL APPLICABILITY

The metal-base circuit board comprising the resin composition for a circuit board of the present invention is excellent in all the solder crack resistance, the thermal conductivity, the adhesive property, and the insulation property and thus is usable for an LED luminescent device and the like.

The invention claimed is:

1. A resin composition for a circuit board, the resin composition comprising:
   component (i), a vinylsilyl group-containing polysiloxane;
   component (ii), a hydrosilyl group-containing polysiloxane; and
   component (iii), an inorganic filler, wherein
   the vinylsilyl group-containing polysiloxane as the component (i) comprises (A) a dual-end type vinylsilyl group-containing polysiloxane having a weight average molecular weight of 30,000 to 80,000 and (B) a side-chain dual-end type vinylsilyl group-containing polysiloxane having a weight average molecular weight of 100,000 or more,
   a mass ratio of (A) to (B), (A)/(B), is 80/20 to 30/70,
   the vinylsilyl group-containing polysiloxane as the component (i) has a vinylsilyl group equivalent of 0.005 to 0.045 mol/kg,
   the hydrosilyl group-containing polysiloxane as the component (ii) has a hydrosilyl group equivalent of 6 mol/kg or more,
   a molar ratio of (C) a hydrosilyl group in the component (ii) to (D) a vinylsilyl group in the component (i), (C)/(D), is 2.5 to 5.0, and
   the inorganic filler as the component (iii) is contained at 60 to 80% by volume.

2. The resin composition for a circuit board according to claim 1, wherein
   the inorganic filler comprises (E) an inorganic filler having an average particle size of 35 to 55 μm, (F) an inorganic filler having an average particle size of 20 to 30 μm, (G) an inorganic filler having an average particle size of 8 to 18 μm, and (H) an inorganic filler having an average particle size of 0.3 to 5 μm, the inorganic filler (E) is contained at 25 to 30% by volume, the inorganic filler (F) is contained at 15 to 20% by volume, the inorganic filler (G) is contained at 15 to 20% by volume, the inorganic filler (H) is contained at 5 to 10% by volume,
   each of the inorganic fillers (E) to (H) has Uniformity Coefficient of 2.5 or more in a Rosin-Rammler particle size distribution equation, and
   one or both of the fillers (E) and (F) comprises aluminum nitride.

3. A metal-base circuit board comprising:
   a metal circuit stacked through an insulating layer on a metal plate, wherein the insulating layer comprises the resin composition for a circuit board according to claim 1.

4. A luminescent device comprising:
   the metal-base circuit board according to claim 3; and
   a LED provided on the metal circuit.

* * * * *